(12) United States Patent
Tian

(10) Patent No.: US 7,032,650 B1
(45) Date of Patent: Apr. 25, 2006

(54) COOLING FIN SET

(75) Inventor: Shan-Min Tian, Chung-Ho (TW)

(73) Assignee: Cooler Master Co., Ltd., Taipei (TW)

( * ) Notice: Subject to any disclaimer, the term of this patent is extended or adjusted under 35 U.S.C. 154(b) by 136 days.

(21) Appl. No.: 11/022,664

(22) Filed: Dec. 28, 2004

(51) Int. Cl.
H05K 7/20 (2006.01)

(52) U.S. Cl. ............ 165/80.3; 165/185; 361/704

(58) Field of Classification Search ............ None
See application file for complete search history.

(56) References Cited

U.S. PATENT DOCUMENTS

| 6,340,056 | B1* | 1/2002 | Huang et al. | 165/185 |
|---|---|---|---|---|
| 6,401,810 | B1* | 6/2002 | Kuo et al. | 165/185 |
| 6,449,160 | B1* | 9/2002 | Tsai | 361/709 |
| 6,595,275 | B1* | 7/2003 | Wang et al. | 165/185 |
| 6,607,023 | B1* | 8/2003 | Ho et al. | 165/78 |
| 6,651,733 | B1* | 11/2003 | Horng et al. | 165/80.3 |
| 6,655,448 | B1* | 12/2003 | Lin | 165/80.3 |
| 6,672,379 | B1* | 1/2004 | Wang et al. | 165/185 |
| 6,766,851 | B1* | 7/2004 | Lo | 165/185 |
| 6,766,852 | B1* | 7/2004 | Chen | 165/185 |
| 6,772,828 | B1* | 8/2004 | Chen | 165/78 |
| 6,871,698 | B1* | 3/2005 | Lee et al. | 165/80.3 |
| 6,883,591 | B1* | 4/2005 | Lai | 165/78 |
| 6,901,993 | B1* | 6/2005 | Lee et al. | 165/80.3 |
| 2004/0159421 | A1* | 8/2004 | Wang | 165/80.3 |
| 2004/0231827 | A1* | 11/2004 | Fu et al. | 165/80.3 |
| 2005/0022972 | A1* | 2/2005 | Cheng-Tung et al | 165/80.3 |
| 2005/0051297 | A1* | 3/2005 | Kuo | 165/80.3 |

* cited by examiner

Primary Examiner—Allen J. Flanigan

(57) ABSTRACT

A cooling fin set, which is disposed on a heat source of a computer, includes a plurality of cooling fins. Each cooling fin includes some fastening portions formed thereon. The fastening portions are folded from the outer periphery of the cooling fin to form a folded side and a hook. The folded side includes an opening for inserting therein a hook of an adjacent cooling fin. An obstacle is formed extended from the rear portion of the opening of the cooling fin. The hook is parallel to the cooling fin, and includes a locking groove formed at the central portion thereof. The locking groove is formed corresponding to the obstacle of the cooling fin for clamping therein the obstacle of the adjacent fin. In this manner, the combination of the cooling fins becomes securely tight. Therefore, the cooling fins will not fall apart due to the vibration in transportation.

6 Claims, 4 Drawing Sheets

COOLING FIN SET

BACKGROUND OF THE INVENTION

The present invention relates generally to a cooling fin set, and more particularly to a cooling fin set that can securely fasten the cooling fins with each other, so as to protect the cooling fins from falling apart due to the vibration in transportation.

Due to the advancement of information technology and computer industry, electronic devices, such as a central processing unit and a memory chip, have a smaller and smaller size and generates more and more heat. In order to maintain an electronic device being operated under a working temperature, a cooling device having a larger cooling surface area is normally attached on the surface of the electronic device, so as to effectively dissipate such concentrated heat to the environment, thereby enhancing the overall cooling rate. However, the cooling device is normally composed of very thin cooling fins. The problem of how to securely fasten each of the thin cooling fins with each other becomes an important issue in the industry.

Referring to FIG. 1 and FIG. 2, a conventional cooling fin set is illustrated. The cooling fin set is primarily composed of a plurality of cooling fins 10a. Two fastening portions 11a are formed at the upper and the lower sides of each cooling fin 10a. The fastening portions 11a are formed on the outer periphery of the cooling fin 10a, which includes a folded protrusion 12a. An opening 12a is formed on the folded protrusion 12a. A bulge 14a is formed extended from the cooling fin 10a at one side of the opening 13a, while a groove 15a is formed at another side of the opening 13a opposite to that of the bulge 14a for incorporating with the bulge 14a. The opening 13a provides the front end of the folded protrusion 12a of an adjacent cooling fin 10a to insert therein, thereby forming a cooling fin set.

However, the conventional cooling fin set described above employs the fastening portions 11a formed on the upper and the lower sides of the cooling fin 10a to harness on the fastening portions 11a of other cooling fins 10a. Nevertheless, the assembly of a cooling fin set by connecting the cooling fins 10a through the fastening portions 11a is rather loose. Thus, the cooling fin set is easily separated apart due to the vibration in transportation or when performing a falling test. In addition, the front end of the folded protrusion 1a of the cooling fin 10a is inserted in the opening 13a of the adjacent cooling fin 10a, and at the same time, the bulge 14a is locked in the groove 15a of the adjacent cooling fin 10a. Therefore, the precision requirement of producing such cooling fins is very high, which renders the manufacturing of such cooling fins very costly.

Therefore, the inventors of the present invention devoted themselves in the study of the aforementioned drawbacks and successfully developed a new cooling fin set that can overcome the above and other problems.

BRIEF SUMMARY OF THE INVENTION

The present invention is to provide a cooling fin set that includes a plurality of cooling fins, each cooling fin being securely combined with an adjacent cooling fin, which is highly unlikely to fall apart due to the vibration in transportation.

In order to achieve the objectives of the present invention, the cooling fin set, which is disposed on a heat source of a computer, includes a plurality of cooling fins. Each cooling fin includes some fastening portions formed thereon. The fastening portions are folded from the outer periphery of the cooling fin to form a folded side and a hook. The folded side includes an opening for inserting therein a hook of an adjacent cooling fin. An obstacle is formed extended from the rear portion of the opening of the cooling fin. The hook is parallel to the cooling fin, and includes a locking groove formed at the central portion thereof. The locking groove is formed corresponding to the obstacle of the cooling fin for clamping therein the obstacle of the adjacent fin.

DETAILED DESCRIPTION OF THE INVENTION

In order to better understanding the features and technical contents of the present invention, the present invention is hereinafter described in detail by incorporating with the accompanying drawings. However, the accompanying drawings are only for the convenience of illustration and description, no limitation is intended thereto.

Figure 1:
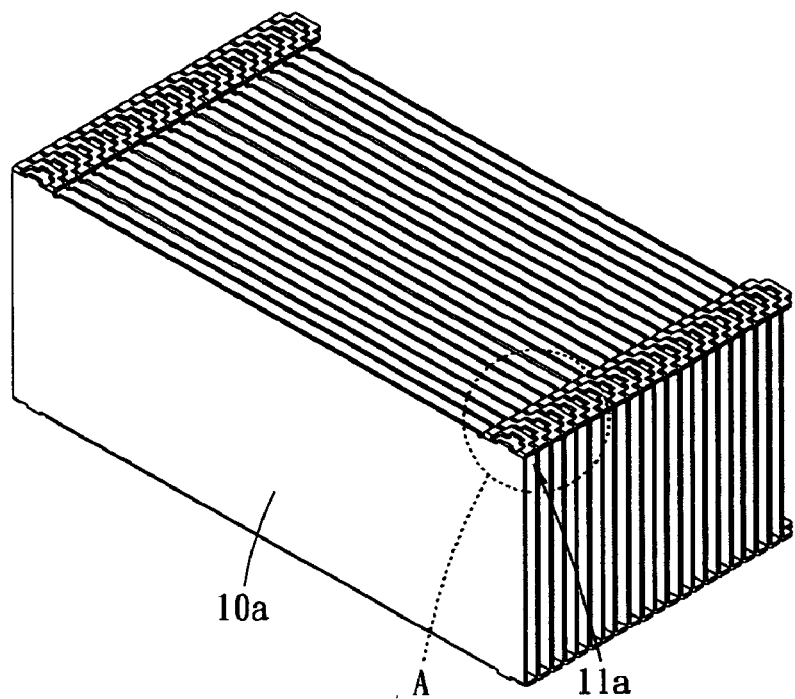
FIG. 1 is a perspective view illustrating a conventional cooling fin set.
Figure 2:
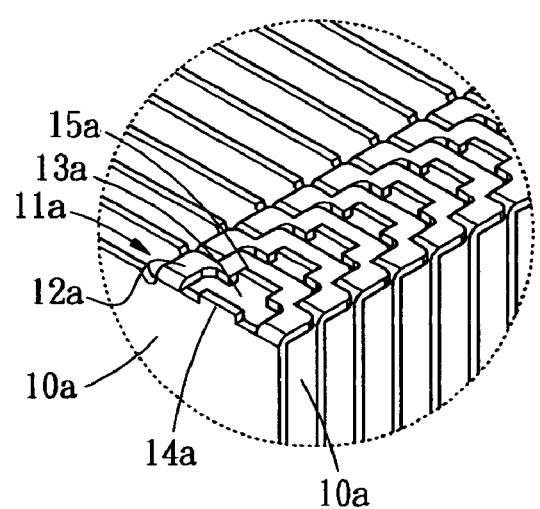
FIG. 2 is an enlarged view of part A in FIG. 1.
Figure 3:
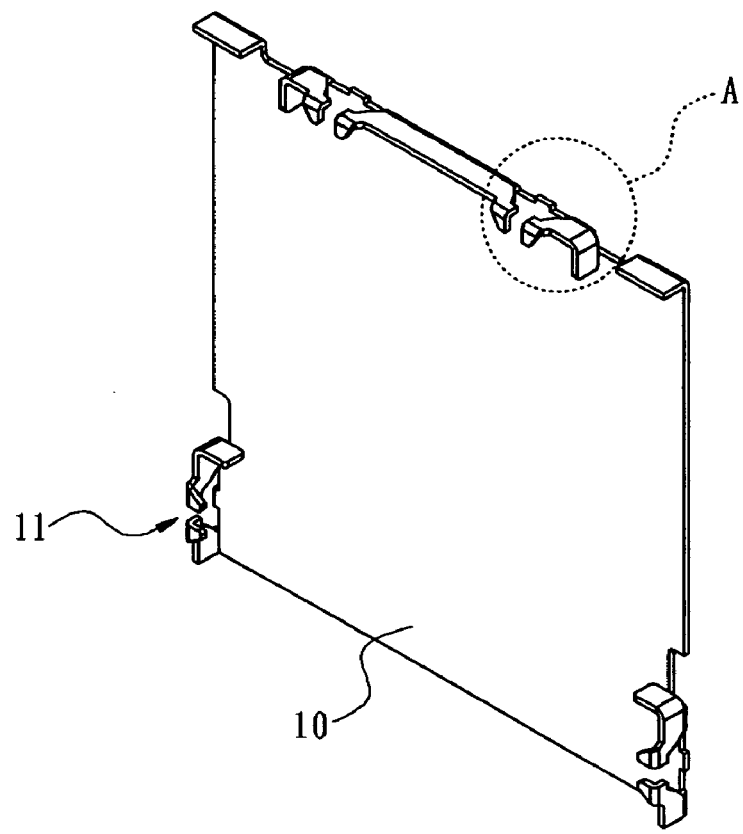
FIG. 3 is a perspective view of a cooling fin set of the present invention.
Figure 4:
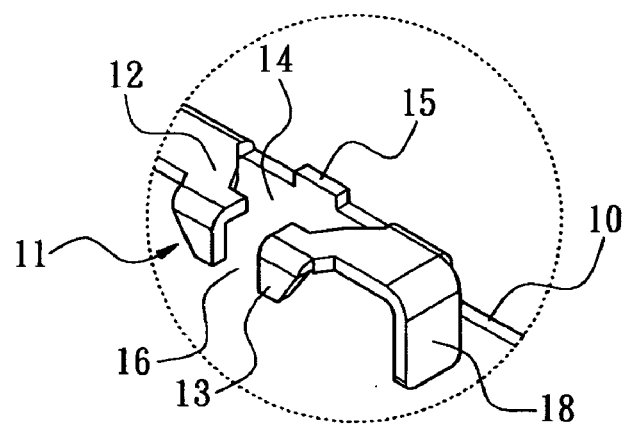
FIG. 4 is an enlarged view of part A in FIG. 3.

Referring to FIG. 3 and FIG. 4, a perspective view of a cooling fin set of the present invention and an enlarged view of part A in FIG. 3 are respectively illustrated. A cooling fin set is composed of a plurality of identical cooling fins 10. Each cooling fin 10 is made of good heat conducting materials, such as aluminum and copper. The cooling fin 10 includes a plurality of fastening portions 11. The fastening portions include two horizontal fastening portions disposed on the top portion of the cooling fin 10 and two vertical fastening portions disposed at the two sides of the cooling fin 10. The fastening portions 11 is formed by being folded at the outer peripheral of the cooling fin 10, thereby forming a folded side 12 and a set of hook 13. The folded side 12 is perpendicular to the cooling fin 10, and has an opening 14, which is narrow in the front and wide in the rear. At the rear of the opening 14, a protrusion 15 is formed extended upward from the cooling fin 10. The hook 13 is parallel to the cooling fin 10, and has a locking groove 16 formed at the center thereof. The locking groove 16 is formed corresponding to the position of the protrusion 15. The protrusion 15 provides the locking groove 16 of an adjacent cooling fin 10 to clamp therein.

In addition, a gap 17 (shown in FIG. 7) is formed at the front end of the folded side 12 and the inner surface of the hook 13. The separation distance of the gap 17 corresponds to the thickness of the cooling fin 10, thereby embedding therein an adjacent cooling fin 10. Furthermore, an obstacle 18 is formed at one side of the folded side 12. The front end of the obstacle 18 aligns with the front end of the folded side 12. The obstacle 18 is folded inward and is perpendicular to the cooling fin 10 and the folded side 12.

Figure 5:
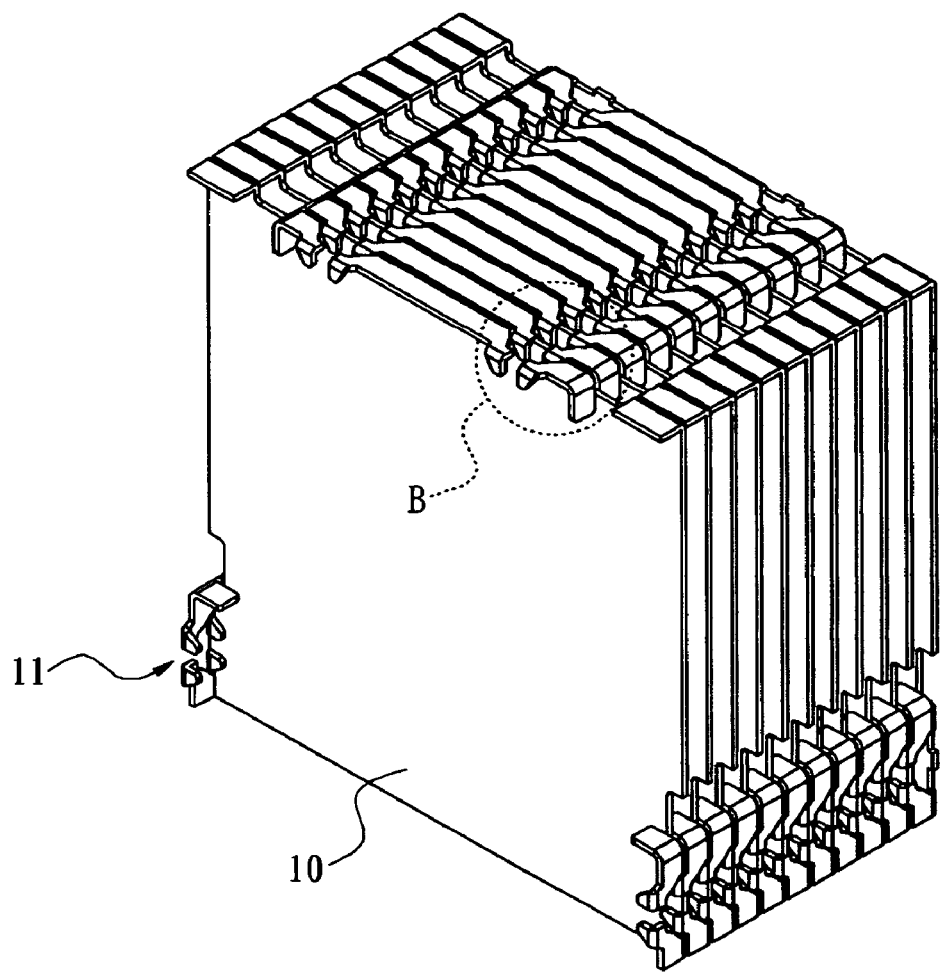
FIG. 5 is a perspective view of a cooling fin set of the present invention.
Figure 6:
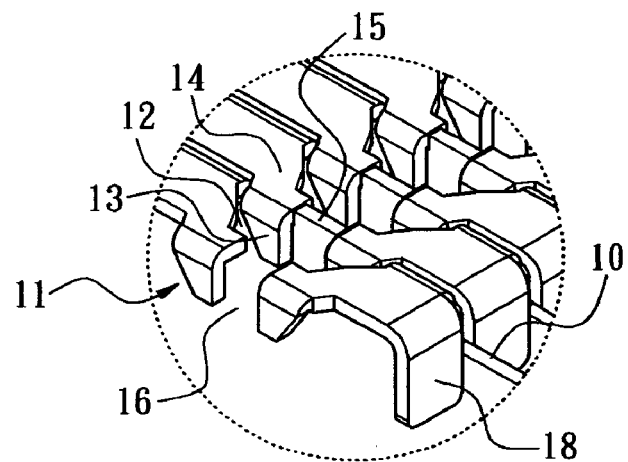
FIG. 6 is an enlarged view of part B in FIG. 5.
Figure 7:
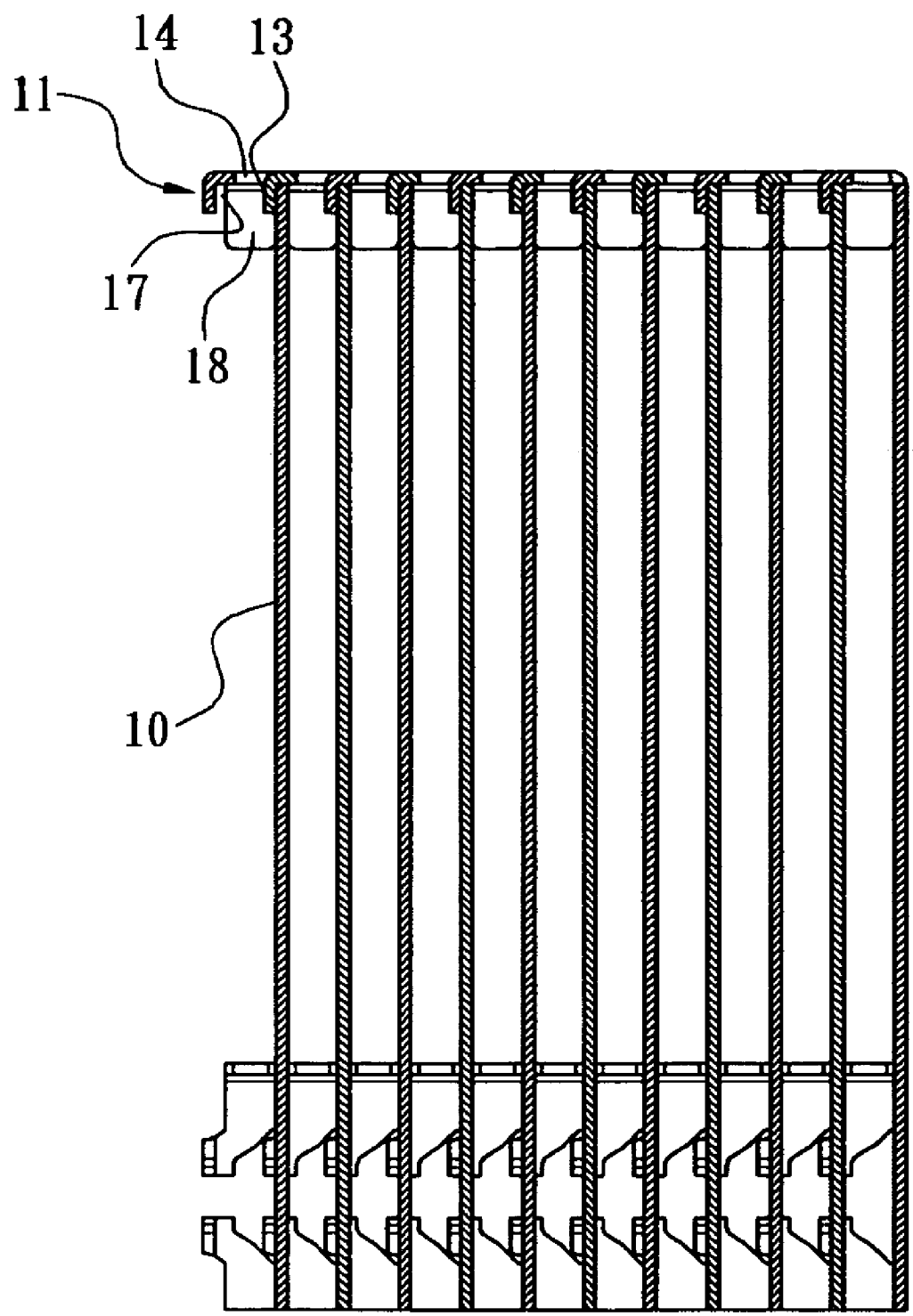
FIG. 7 is a sectional view of the cooling fin set of the present invention.

Referring to FIG. 5, FIG. 6 and FIG. 7, the cooling fin set of the present invention is illustrated. When assembling a cooling fin set, the folded side 12 of the cooling fin 10 is formed first, so as to make the hook 13 of the fastening portion 111 extended along the direction of the folded side 12. Another cooling fin 10 is then stacked on the present cooling fin 10, aligning the fastening portions 11 of one cooling fin 10 to the fastening portions 11 of the adjacent cooling fin 10. Meanwhile, the obstacle 15 of the cooling fin 10 is clamped in the locking groove 16 of the adjacent cooling fin 10, and the bottom surface of the cooling fin 10 is lying on the obstacle 18 of the adjacent cooling fin 10. By using a special manufacturing tool, the hook 13 of the fastening portions 11 of the cooling fin 10 is pressed onto the top portion of the cooling fin 10. In this manner, the combination of the cooling fins 11 becomes securely tight. Therefore, the cooling fins 10 will not fall apart due to the vibration in transportation.

In summary, the cooling fin set of the present invention is useful, new and non-obvious, which satisfies the patentability requirements of the patent law. Therefore, a utility patent application is filed accordingly, and a grant of letters patent is hereby respectfully requested.

Since, any person having ordinary skill in the art may readily find various equivalent alterations or modifications in light of the features as disclosed above, it is appreciated that the scope of the present invention is defined in the following claims. Therefore, all such equivalent alterations or modifications without departing from the subject matter as set forth in the following claims is considered within the spirit and scope of the present invention.

What is claimed is:

1. A cooling fin set, comprising a plurality of cooling fins, each cooling fin comprising a plurality of fastening portions formed thereon, the fastening portions being folded from the outer periphery of the cooling fin to form a folded side and a hook, the folded side comprising an opening for inserting therein a hook of an adjacent cooling fin, an obstacle being formed extended from the rear portion of the opening of the cooling fin, the hook being parallel to the cooling fin and comprising a locking groove formed at the central portion thereof, the locking groove corresponding the obstacle of the cooling fin for clamping therein the obstacle of the adjacent fin.

2. The cooling fin set as recited in claim 1, wherein the fastening portions comprises two horizontal fastening portions formed on the top portion of the cooling fin and two vertical fastening portions formed on the two side portions of the cooling fin.

3. The cooling fin set as recited in claim 2, wherein the folded side of the fastening portion is perpendicular to the cooling fin.

4. The cooling fin set as recited in claim 3, wherein a gap is formed between the front end of the folded side and the inner surface of the hook, the separation distance of the gap being substantially the same as that of the cooling fin for embedding therein the adjacent cooling fin.

5. The cooling fin set as recited in claim 4, wherein an obstacle is formed at one side of the folded side, the front end of the obstacle being aligned with the front end of the folded side.

6. The cooling fin set as recited in claim 5, wherein the obstacle is folded inward and perpendicular to the cooling fin and the folded side.

\* \* \* \* \*